(12) United States Patent
Kotoku et al.

(10) Patent No.: US 8,779,396 B2
(45) Date of Patent: Jul. 15, 2014

(54) DRAWING APPARATUS, AND METHOD OF MANUFACTURING ARTICLE

(71) Applicant: Canon Kabushiki Kaisha, Tokyo (JP)

(72) Inventors: Masashi Kotoku, Utsunomiya (JP); Kuniyasu Haginiwa, Yokohama (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/705,754

(22) Filed: Dec. 5, 2012

(65) Prior Publication Data

US 2013/0164692 A1   Jun. 27, 2013

(30) Foreign Application Priority Data

Dec. 27, 2011   (JP) ................................ 2011-286620

(51) Int. Cl.
*G21K 5/04*   (2006.01)

(52) U.S. Cl.
USPC ................ 250/492.22; 250/492.1; 250/492.3; 250/396 R; 250/397

(58) Field of Classification Search
USPC .......... 250/396 R, 397, 492.1, 492.2, 492.21, 250/492.22, 492.23, 492.3
See application file for complete search history.

(56) References Cited

U.S. PATENT DOCUMENTS

| 2006/0108541 A1* | 5/2006 | Koike ........................ 250/491.1 |
| 2006/0145097 A1* | 7/2006 | Parker ....................... 250/492.22 |
| 2007/0057204 A1* | 3/2007 | Kruit et al. ................ 250/492.23 |
| 2008/0054188 A1* | 3/2008 | Usa et al. ...................... 250/400 |
| 2011/0231134 A1* | 9/2011 | Yoshitake ........................ 702/94 |

FOREIGN PATENT DOCUMENTS

| JP | 8-505003 A | 5/1996 |
| WO | 94/10633 A | 5/1994 |

* cited by examiner

*Primary Examiner* — Nicole Ippolito
(74) *Attorney, Agent, or Firm* — Rossi, Kimms & McDowell LLP

(57) ABSTRACT

The present invention provides a drawing apparatus which performs drawing on a substrate with a charged particle beam based on drawing data generated from pattern data representing a circuit pattern to be drawn on the substrate, and mark data representing a mark to be drawn on the substrate, the apparatus including an obtaining unit configured to obtain information associated with a positioning accuracy of the charged particle beam relative to the substrate, a determination unit configured to determine a drawing region for the mark based on the obtained information, and a generation unit configured to generate the drawing data by combining the pattern data and the mark data such that the mark is drawn in the determined drawing region.

11 Claims, 9 Drawing Sheets

DRAWING APPARATUS, AND METHOD OF MANUFACTURING ARTICLE

BACKGROUND OF THE INVENTION

1. Field of the Invention

The present invention relates to a drawing apparatus, and a method of manufacturing an article.

2. Description of the Related Art

As one of lithography apparatuses used to manufacture, for example, semiconductor devices, a charged particle beam drawing apparatus which draws a pattern on (transfers it onto) a substrate with a charged particle beam (electron beam) has been known. Charged particle beam drawing apparatuses are roughly classified into a single-beam drawing apparatus which performs drawing with one charged particle beam, and a multibeam drawing apparatus which performs drawing with a plurality of charged particle beams. A multibeam drawing apparatus is attracting a great deal of attention as an apparatus available for mass production because the throughput is expected to improve more than a single-beam drawing apparatus.

A charged particle beam drawing apparatus deflects (scans) a charged particle beam along a design coordinate system set on a substrate, and controls ON/OFF of the irradiation (blanking) of the substrate with the charged particle beam, thereby drawing a pattern on the substrate. A charged particle beam drawing apparatus converts design data representing a pattern (circuit pattern) to be drawn on a substrate into drawing data, and controls ON/OFF of the irradiation of the substrate with a charged particle beam based on the drawing data, regardless of whether the charged particle beam drawing apparatus is of the single-beam or multibeam type. Note that the design data is CAD data or vector data, and the drawing data is bitmap data. Japanese Patent Laid-Open No. 8-505003 proposes a technique of converting CAD data or vector data (design data) into bitmap data.

In recent years, with an increase in pattern dimension accuracy required for a charged particle beam drawing apparatus, that is, a reduction in minimum line width of the pattern, the size of drawing data (data volume) required to draw a pattern in a region corresponding to one chip is becoming enormous. On the other hand, to utilize a charged particle beam drawing apparatus for mass production, an improvement in throughput is necessary, so a large amount of data including such drawing data must be processed at high speed. However, in terms of data size, it is difficult to hold design data (CAD data or vector data) upon bitmap rasterization in advance, that is, in the form of drawing data (bitmap data). Therefore, the charged particle beam drawing apparatus stores data representing a pattern in its internal storage unit as design data, reads out the design data stored in the storage unit in the order of drawing in drawing a pattern, and performs bitmap rasterization (conversion) into drawing data.

In the related art technique, the design data includes not only a pattern to be drawn on a substrate but also a mark such as an alignment mark or an inspection mark, so it is impossible to change the mark drawing position or drawing timing immediately before drawing a pattern. However, to draw a pattern as fine as the recently required pattern, it is necessary to change the mark drawing position and drawing timing in accordance with the state of a substrate and that of a charged particle beam drawing apparatus.

The case wherein, for example, an alignment mark (inspection mark) is drawn in a region in which the flatness of a substrate is poor as dust has adhered to the front or back surface of the substrate will be considered. In this case, when the charged particle beam and the substrate are aligned using the alignment mark, the alignment error may increase. In addition, it takes a longer time for a charged particle beam drawing apparatus than for an exposure apparatus to draw a pattern. Therefore, due to a shift between the drawing timing of a main pattern (critical pattern) and that of an alignment mark, the alignment error for the main pattern in a subsequent drawing (exposure) operation may increase.

SUMMARY OF THE INVENTION

The present invention provides, for example, a drawing apparatus advantageous in terms of drawing of a mark.

According to one aspect of the present invention, there is provided a drawing apparatus which performs drawing on a substrate with a charged particle beam based on drawing data generated from pattern data representing a circuit pattern to be drawn on the substrate, and mark data representing a mark to be drawn on the substrate, the apparatus including an obtaining unit configured to obtain information associated with a positioning accuracy of the charged particle beam relative to the substrate, a determination unit configured to determine a drawing region for the mark based on the obtained information, and a generation unit configured to generate the drawing data by combining the pattern data and the mark data such that the mark is drawn in the determined drawing region.

Further features of the present invention will become apparent from the following description of exemplary embodiments with reference to the attached drawings.

DESCRIPTION OF THE EMBODIMENTS

Figure 1:
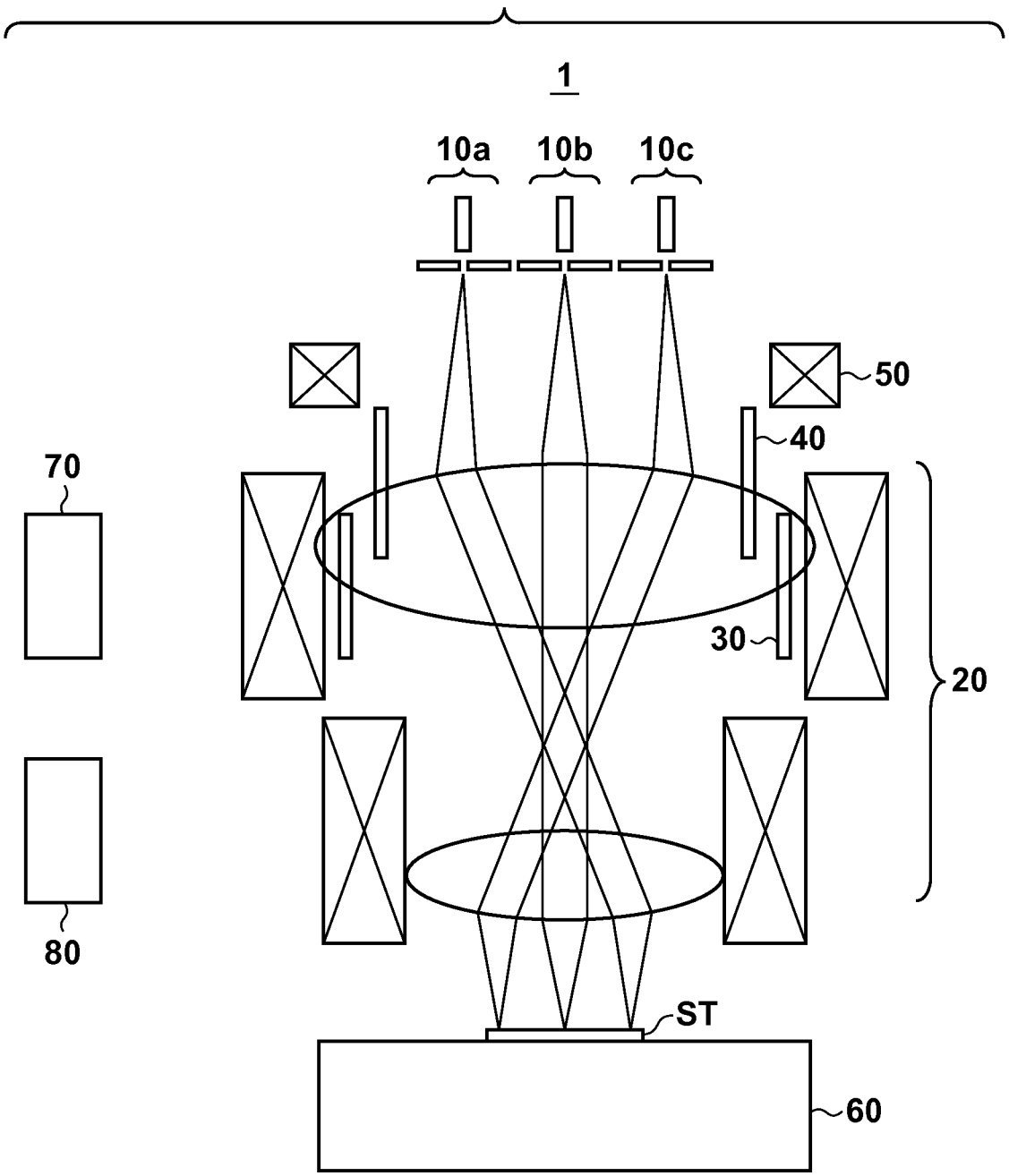
FIG. 1 is a view showing the configuration of a drawing apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a block diagram showing the configuration of a drawing apparatus 1 according to an aspect of the present invention. The drawing apparatus 1 serves as a lithography apparatus which draws a pattern on a substrate with a charged particle beam (electron beam). Although the drawing apparatus 1 is implemented as a multibeam drawing apparatus in this embodiment, it may be implemented as a single-beam drawing apparatus.

The drawing apparatus 1 includes a plurality of electron sources 10a, 10b, and 10c, charged particle optical system 20, deflector 30, dynamic focus coil 40, dynamic astigmatism coil 50, substrate stage 60, drawing data generation unit 70, and control unit 80.

Each of the electron sources 10a, 10b, and 10c includes, for example, an electron gun, and undergoes individual control of ON/OFF of the irradiation with a charged particle beam (electron beam). The charged particle optical system 20 guides the charged particle beams from the electron sources 10a, 10b, and 10c, respectively, onto a substrate ST. The deflector 30 deflects (scans) the charged particle beams guided onto the substrate ST by the charged particle optical system 20. The dynamic focus coil 40 corrects the focus positions of the charged particle beams which pass through the charged particle optical system 20, in accordance with deflection aberrations generated in these charged particle beams upon the operation of the deflector 30. The dynamic astigmatism coil 50 corrects the astigmatisms of the charged particle beams which pass through the charged particle optical system 20, in accordance with deflection aberrations generated in these charged particle beams. The substrate stage 60 moves upon holding the substrate ST.

In the drawing apparatus 1, the electron sources 10a, 10b, and 10c, charged particle optical system 20, deflector 30, dynamic focus coil 40, dynamic astigmatism coil 50, and substrate stage 60 constitute a drawing process unit. The drawing process unit performs a drawing process under the control of the control unit 80.

Since the drawing data generation unit 70 has a function of, for example, converting CAD data or vector data into bitmap data, and generates drawing data corresponding to a pattern to be drawn on the substrate ST. The drawing data generation unit 70 will be described in more detail later.

The control unit 80 includes, for example, a CPU and memory and controls the overall drawing apparatus 1 (its operation). For example, the control unit 80 controls the drawing process unit (each unit constituting it) based on the drawing data generated by the drawing data generation unit 70 to scan the charged particle beams on the substrate ST, thereby drawing a pattern on the substrate ST.

Figure 2:
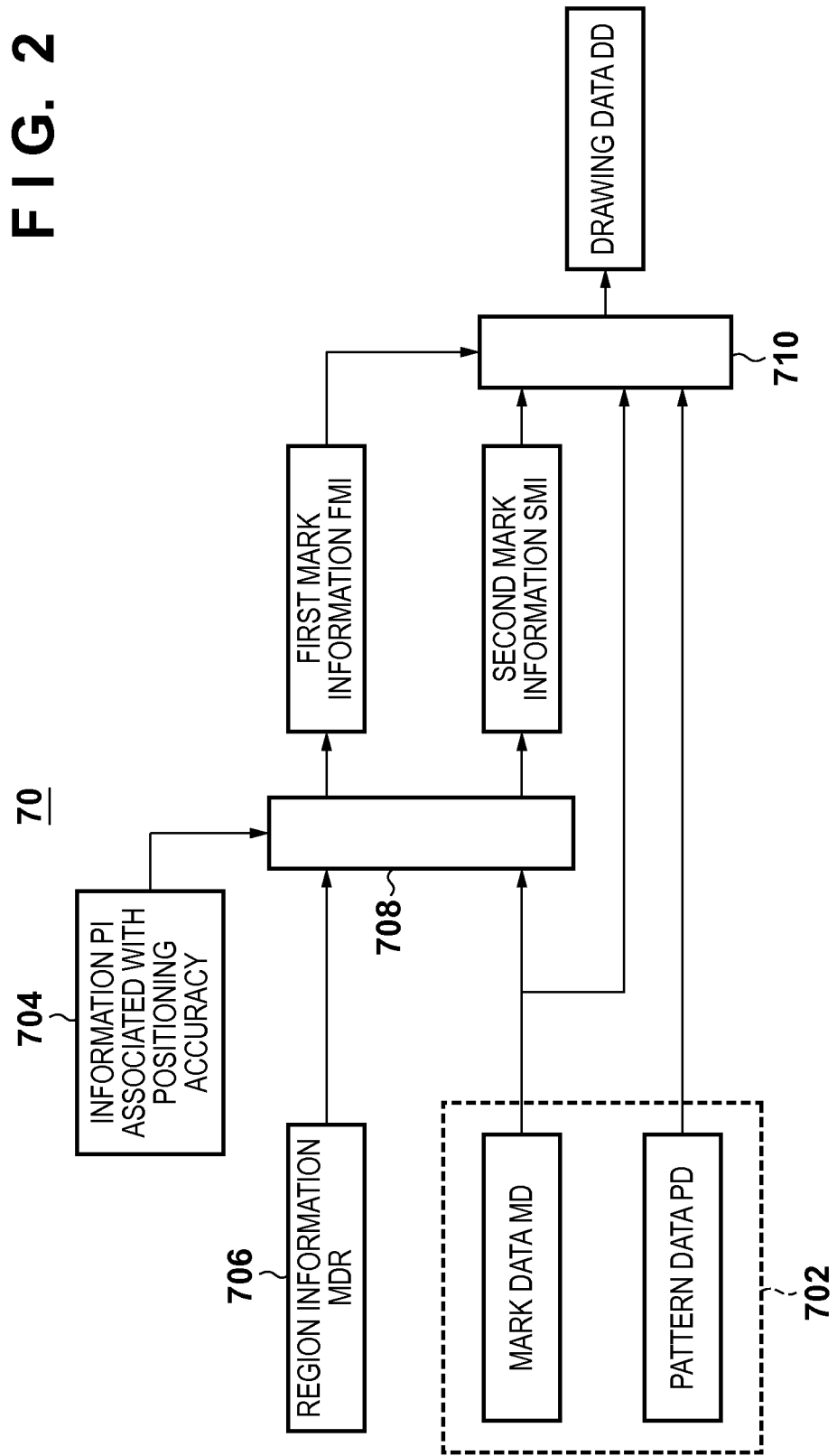
FIG. 2 is a block diagram showing the basic configuration of a drawing data generation unit in the drawing apparatus shown in FIG. 1.

The outline of generation of drawing data by the drawing data generation unit 70 will be explained herein with reference to FIG. 2. FIG. 2 is a block diagram showing the basic configuration of the drawing data generation unit 70. The drawing data generation unit 70 includes a storage unit 702, obtaining unit 704, holding unit 706, determination unit 708, and generation unit 710.

The storage unit 702 stores CAD data or vector data as design data. As described above, in the related art technique, the design data includes pattern data representing a circuit pattern to be drawn on a substrate, and mark data representing a mark (alignment mark or inspection mark) to be drawn on the substrate in order to measure or inspect the substrate. In other words, in the related art technique, a circuit pattern and mark data are stored as one design data without distinction. In contrast to this, in this embodiment, the storage unit 702 stores, as independent data, pattern data PD representing a circuit pattern to be drawn on the substrate ST, and mark data MD representing marks to be drawn on the substrate ST. However, of the mark data MD, mark data representing a mark to be drawn in a drawing region (at a drawing position) which need not be flexibly changed in accordance with the apparatus conditions because it requires low drawing position accuracy, or a mark to be drawn in a fixed region may partly serve as the pattern data PD.

The obtaining unit 704 obtains information PI associated with the positioning accuracy of the charged particle beams relative to the substrate ST. Note that the information PI includes at least one of, for example, surface shape information (flatness information) SI indicating the flatness of the substrate ST at each position, time information TI indicating the execution time of calibration of the drawing apparatus 1, and environment information EI indicating the environment of the drawing apparatus 1.

The holding unit 706 holds region information MDR indicating a region in which a mark (for example, an alignment mark or an inspection mark) can be drawn on the substrate ST. The region in which a mark can be drawn means herein a region within which a mark can be drawn freely. Also, the region information MDR may be arbitrarily set by the user, or automatically set by the drawing apparatus 1 based on the circuit pattern (pattern data PD) to be drawn on the substrate ST.

The determination unit 708 determines the mark drawing region relative to a circuit pattern to be drawn on the substrate ST from the region indicated by the region information MDR held in the holding unit 706, based on the information PI obtained by the obtaining unit 704. In other words, the determination unit 708 analyzes the information PI and region information MDR to determine an optimum mark drawing region (drawing timing) on the substrate ST, and the mark shape and dimension. Also, the determination unit 708 generates first mark information FMI indicating the determined mark drawing region, and second mark information SMI indicating the determined mark shape and dimension, and inputs them to the generation unit 710. Note that the determination unit 708 can arbitrarily determine the mark drawing region based on the information PI obtained by the obtaining unit 704, independently of the region information MDR held in the holding unit 706.

The generation unit 710 combines the pattern data PD and mark data MD stored in the storage unit 702 so as to draw a mark in the drawing region determined by the determination unit 708, thereby generating drawing data DD. More specifically, the generation unit 710 generates combined data by combining the pattern data PD and mark data MD based on the first mark information FMI and second mark information SMI, and converts the combined data into bitmap data, thereby generating drawing data DD.

In the drawing apparatus 1, the drawing region (drawing position) and the drawing timing are integral, so the drawing timing is determined if the drawing region is determined, and vice versa. Hence, the drawing timing is determined to satisfy a required drawing region in some cases, while the drawing region is determined to satisfy a required drawing timing in other cases.

Also, in the drawing apparatus 1, certain amounts of pattern data and mark data (for example, pattern data and mark data corresponding to one chip) are combined to generate drawing data before the start of drawing in some cases, while pattern data and mark data are combined in the order of drawing to sequentially generate drawing data in other cases. Although both cases can be coped with in each embodiment to be described hereinafter, the second embodiment (the case wherein a drawing region is determined to satisfy a required drawing timing) assumes that pattern data and mark data are combined in the order of drawing to sequentially generate drawing data. However, even in the second embodiment, certain amounts of pattern data and mark data can be combined to generate drawing data before the start of drawing, depending on the conditions involved.

The drawing data generation unit 70 will be described in more detail below in each embodiment.

First Embodiment

Figure 3:
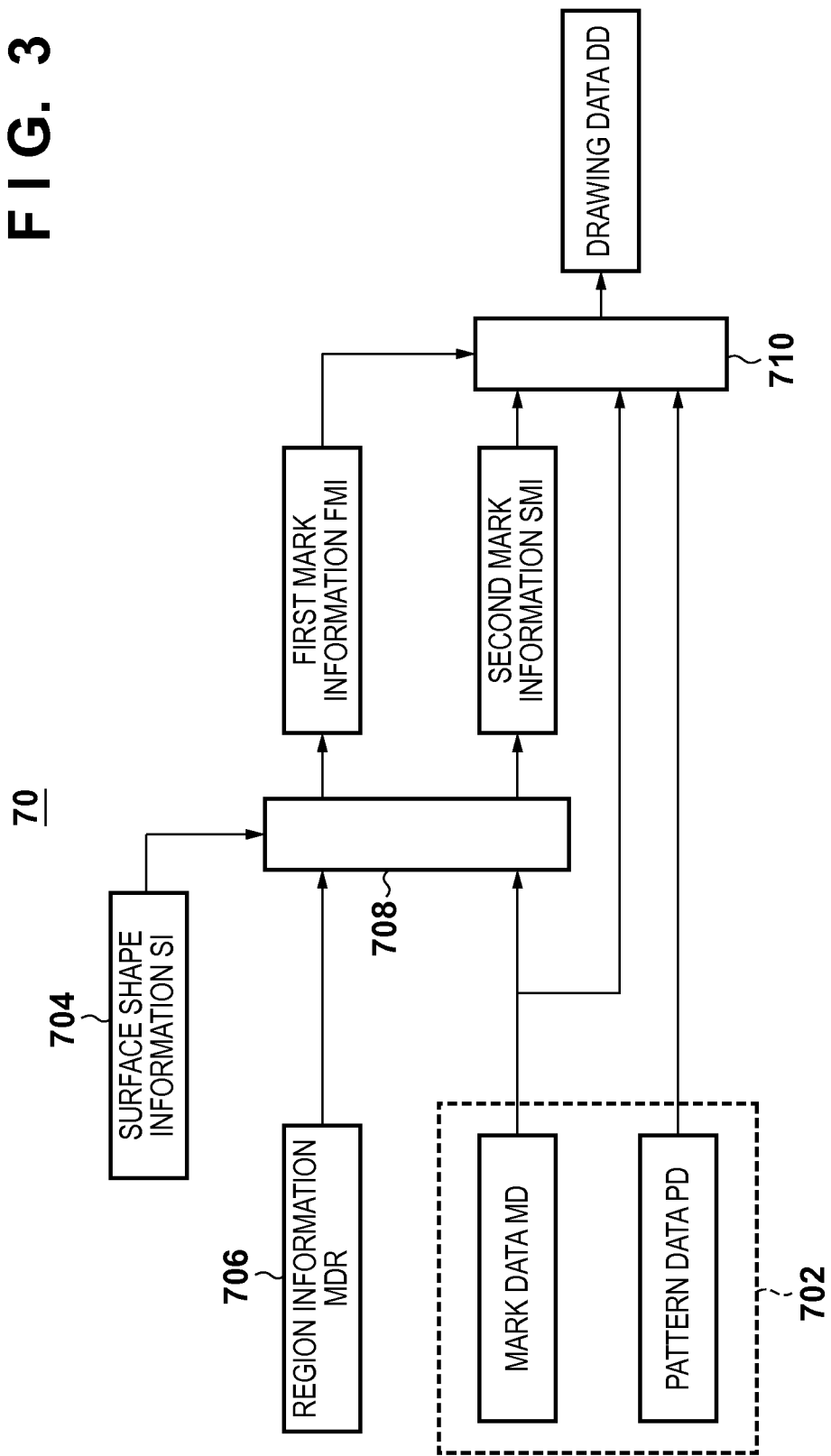
FIG. 3 is a block diagram showing the configuration of a drawing data generation unit in the first embodiment.

FIG. 3 is a block diagram showing the configuration of a drawing data generation unit 70 in the first embodiment. When a mark such as an alignment mark or an inspection mark is drawn in a region having dust adhered to it or a region with a rough surface shape within the entire region on a substrate ST, this degrades the alignment accuracy or inspection accuracy. This makes it necessary to avoid drawing a mark in such a region.

Hence, in this embodiment, an obtaining unit 704 obtains surface shape information SI indicating the flatness of the substrate ST at each position as information PI associated with the positioning accuracy of charged particle beams on the substrate ST. In a process of inspecting a focus deviation within the substrate plane, the focus positions in, for example, a region having dust adhered in it and a region with a rough surface shape on the substrate ST are considerably different from those in other regions. Therefore, the surface shape information SI can be obtained from a focus deviation within the substrate plane.

A determination unit 708 determines, based on the surface shape information SI, the mark drawing region from a region in which the flatness falls within a tolerance (a region which satisfies a required flatness), for example, a region having no dust adhered in it within a region indicated by region information MDR held in a holding unit 706. However, if the region indicated by the region information MDR includes no sufficient region which satisfies a required flatness, the determination unit 708 can change the mark shape and dimension. In other words, the determination unit 708 can determine the mark shape and dimension so as to draw a mark in a region which satisfies a required flatness. In general, the mark shape and dimension are integrally determined, so the mark shape changes with a change in mark dimension.

If the region indicated by the region information MDR includes no sufficient region which satisfies a required flatness, the determination unit 708 displays an error (or warning) message for notifying to that effect on a display unit (not shown) of a drawing apparatus 1, or records an error log in, for example, a memory of a control unit 80. Alternatively, if the region indicated by the region information MDR includes no sufficient region which satisfies a required flatness, the determination unit 708 may determine, as a mark drawing region, the drawing region designated by default setting, independently of the region information MDR or the surface shape information SI.

According to this embodiment, since a drawing region in which a mark such as an alignment mark or an inspection mark is drawn can be determined (changed) in accordance with the flatness of the substrate ST, degradation in alignment accuracy and inspection accuracy can be suppressed (prevented). Also, in this embodiment, regardless of whether a multibeam or single-beam drawing apparatus is used, the drawing timing is uniquely determined in accordance with the mark drawing position as the mark drawing region is determined.

Second Embodiment

Figure 4:
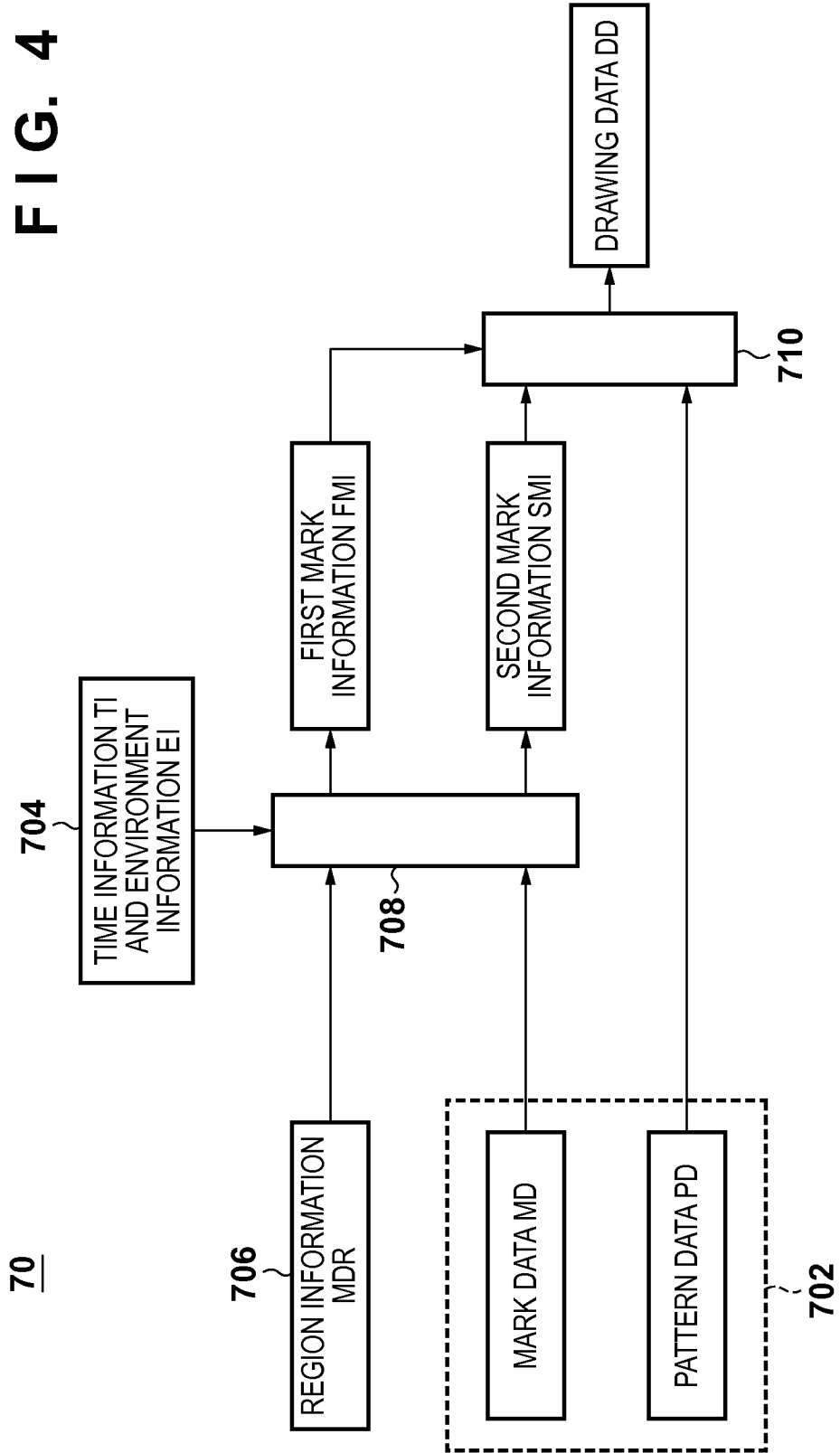
FIG. 4 is a block diagram showing the configuration of a drawing data generation unit in the second embodiment.

FIG. 4 is a block diagram showing the configuration of a drawing data generation unit 70 in the second embodiment. In this embodiment, the state of a drawing apparatus 1 is monitored in real time, and a mark such as an alignment mark or an inspection mark is drawn upon an interruption in accordance with the state of the drawing apparatus 1. Therefore, pattern data PD is read out in the order of drawing, or is divided into minute regions and combined with mark data MD to generate drawing data DD upon an interruption.

Hence, in this embodiment, an obtaining unit 704 obtains time information TI indicating the execution time of calibration of the drawing apparatus 1, and environment information EI indicating the environment of the drawing apparatus 1. A determination unit 708 determines the mark drawing region by setting a mark drawing flag when the drawing conditions under which a mark is drawn are satisfied, based on the time information TI and environment information EI obtained by the obtaining unit 704. Note that the environment information EI includes, for example, temperature information indicating the temperature of a substrate ST.

When the obtaining unit 704 obtains the environment information EI, the determination unit 708 determines the mark drawing region (drawing timing) so as to draw a mark at the timing at which the temperature of the substrate ST reaches a predetermined temperature. In other words, the determination unit 708 determines the mark drawing region from a region indicated by region information MDR held in a holding unit 706, based on the environment information EI so as to draw a mark at the timing at which the environment of the drawing apparatus 1 falls within a tolerance. This makes it possible to draw a pattern on the substrate ST free from the influence of a change in temperature of the substrate ST.

Also, when the obtaining unit 704 obtains the time information TI, the determination unit 708 determines the mark drawing region (drawing timing) so as to draw a mark immediately after the drawing apparatus 1 calibrated. In other words, the determination unit 708 determines the mark drawing region from the region indicated by the region information MDR held in the holding unit 706, based on the time information TI, so as to draw a mark within a predetermined period after the execution time of calibration of the drawing apparatus 1.

In the drawing apparatus 1, in practice, the drawing timing at which a circuit pattern and a mark are drawn can be detected in advance, and then drawing data can be generated with a sufficient margin before a circuit pattern and a mark are drawn. When, for example, the schedule of calibration of the drawing apparatus 1 is determined in advance, drawing can be started after pattern data PD and mark data MD corresponding to one chip are combined to generate drawing data DD.

Although the mark drawing timing is uniquely determined in accordance with the environment information EI and time information TI in this embodiment, it may be changed for each mark drawing operation or for each type of mark.

In the case of a multibeam drawing apparatus, it is possible to simultaneously draw a circuit pattern and a mark because the field of drawing in parallel is large. Therefore, the mark drawing region (drawing timing) can be determined so as to draw a mark at the same timing as the timing at which a circuit pattern is drawn. More specifically, the mark drawing region is determined from a region, in which a mark can be drawn, so as to draw a mark at the timing at which a mark drawing flag is set, or at a timing as close to it as possible.

On the other hand, in the case of a single-beam drawing apparatus, it is impossible to simultaneously draw a circuit pattern and a mark. Therefore, the mark drawing region can be determined from a region, in which a mark can be drawn, so as to draw a mark at a timing as immediately after a mark drawing flag is set as possible. However, in a single-beam drawing apparatus, a substrate stage 60 must be moved in drawing a mark, so the mark drawing accuracy may become lower than in a multibeam drawing apparatus.

The obtaining unit 704 can obtain surface shape information SI in addition to the environment information EI and time information TI. In this case, a region in which the flatness falls outside a tolerance may be excluded from the region indicated by the region information MDR held in the holding unit 706, based on the surface shape information SI, before the mark drawing region is determined. In this manner, by updating the region information MDR held in the holding unit 706, the mark drawing region can be efficiently determined based on the environment information EI and time information TI.

As in the first embodiment, if the region indicated by the region information MDR held in the holding unit 706 includes no sufficient region which satisfies a required flatness, the determination unit 708 can change the mark shape and dimension.

If the region indicated by the region information MDR includes no region which satisfies a required flatness, the determination unit 708 displays an error (or warning) message for notifying to that effect on a display unit (not shown) of the drawing apparatus 1, or records an error log in, for example, a memory of a control unit 80. However, if the region indicated by the region information MDR includes no region which satisfies a required flatness, the determination unit 708 may determine, as a mark drawing region, the drawing region designated by default setting, independently of the environment information EI or the time information TI.

According to this embodiment, since a drawing region in which a mark such as an alignment mark or an inspection mark is drawn can be determined (changed) in accordance with the state of the drawing apparatus 1, degradation in alignment accuracy and inspection accuracy can be suppressed (prevented).

Third Embodiment

Figure 5:
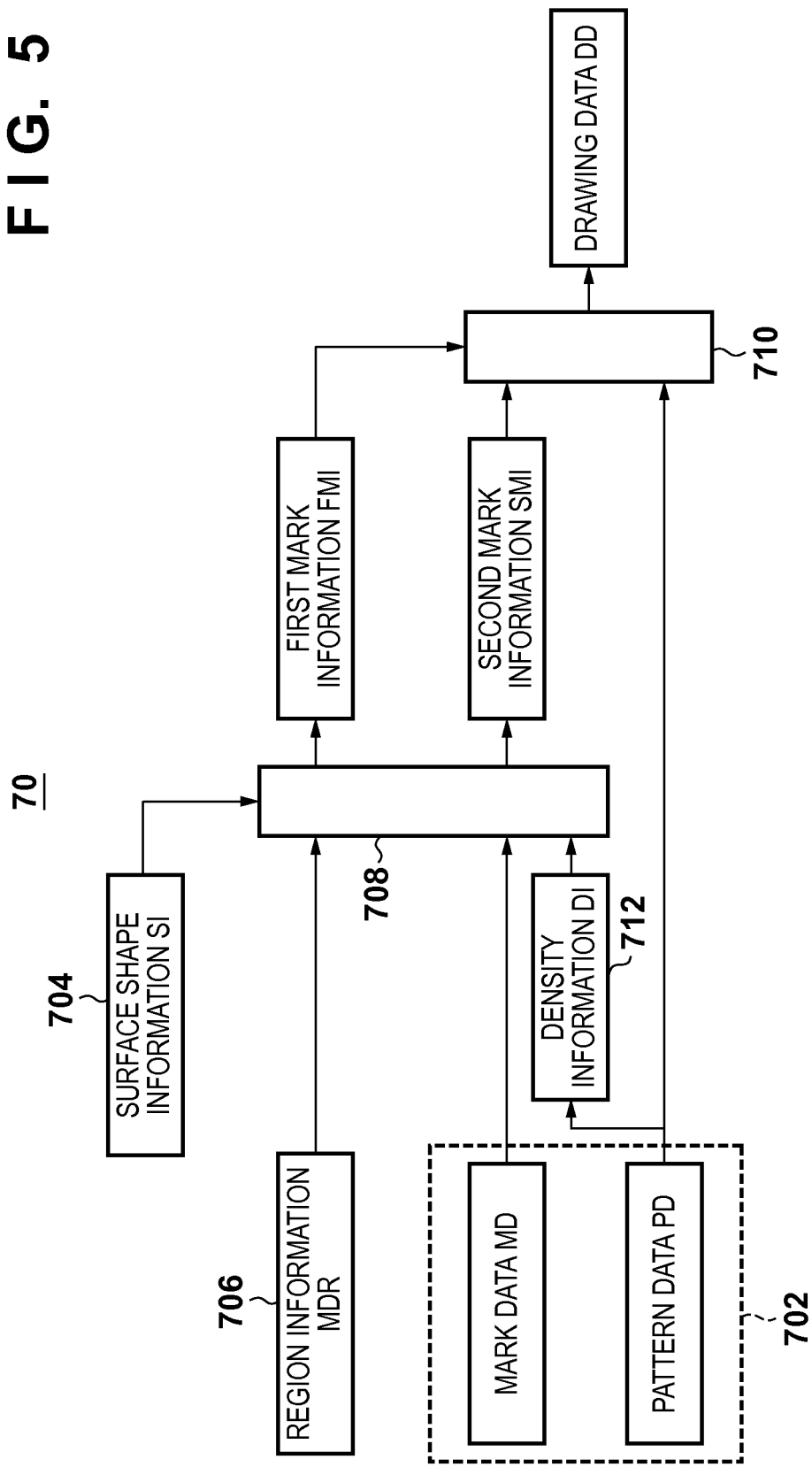
FIG. 5 is a block diagram showing the configuration of a drawing data generation unit in the third embodiment.

FIG. 5 is a block diagram showing the configuration of a drawing data generation unit 70 in the third embodiment. It takes a longer time for a drawing apparatus 1 which performs drawing on a substrate ST with charged particle beams than for an exposure apparatus to draw a pattern, so the alignment accuracy often degrades while the drawing apparatus 1 draws a pattern. Therefore, in this embodiment, degradation in alignment accuracy due to a shift in drawing timing is suppressed (prevented) by matching the drawing timing of a main circuit pattern (critical pattern) with that of a mark such as an alignment mark.

Hence, in this embodiment, the drawing data generation unit 70 includes a calculation unit 712 which analyzes pattern data PD stored in a storage unit 702 to calculate density information DI indicated by the density (packing density) of pattern elements which form the circuit pattern. In other words, the calculation unit 712 functions as an obtaining unit which obtains the density information DI. Also, the determination unit 708 specifies pattern elements (pattern element group), that is, a critical pattern having a density equal to or higher than a predetermined value, based on the density information DI calculated by the calculation unit 712. A determination unit 708 then determines the mark drawing region from a region, indicated by region information MDR held in a holding unit 706, so as to draw a mark in parallel with drawing of the specified critical pattern.

In this manner, in this embodiment, the mark drawing region (drawing timing) is determined in accordance with the drawing timing of the critical pattern. However, when identical circuit patterns are drawn in all of a plurality of chip regions (shot regions) on the substrate ST, there is no need to draw marks in all chip regions. Alternatively, the mark drawing region (drawing timing) may be changed for each chip region on the substrate ST.

In the case of a multibeam drawing apparatus, it is possible to simultaneously draw a circuit pattern and a mark because the field of drawing in parallel is large, as described above. Therefore, the mark drawing region (drawing timing) can be determined so as to draw a mark in parallel with drawing of a circuit pattern. More specifically, the mark drawing region is determined from a region, in which a mark can be drawn, so as to draw a mark at the timing at which a critical pattern is drawn, or at a timing as close to it as possible.

On the other hand, in the case of a single-beam drawing apparatus, it is impossible to simultaneously draw a circuit pattern and a mark. Therefore, the mark drawing region can be determined from a region, in which a mark can be drawn, so as to draw a mark at a timing as close to that at which a critical pattern is drawn as possible. However, in a single-beam drawing apparatus, a substrate stage 60 must be moved in drawing a mark, so the mark drawing accuracy may become lower than in a multibeam drawing apparatus.

If an obtaining unit 704 obtains surface shape information SI, a region in which the flatness falls outside a tolerance may be excluded from the region indicated by the region information MDR held in the holding unit 706, based on the surface shape information SI, before the mark drawing region is determined. In this manner, by updating the region information MDR held in the holding unit 706, the mark drawing region can be efficiently determined based on the density information DI.

As in the first embodiment, if the region indicated by the region information MDR held in the holding unit 706 includes no sufficient region which satisfies a required flatness, the determination unit 708 can change the mark shape and dimension.

If the region indicated by the region information MDR includes no region which satisfies a required flatness, the determination unit 708 displays an error (or warning) message for notifying to that effect on a display unit (not shown) of the drawing apparatus 1, or records an error log in, for example, a memory of a control unit 80. However, if the region indicated by the region information MDR includes no region which satisfies a required flatness, the determination unit 708 may determine, as a mark drawing region, the drawing region designated by default setting, independently of the density information DI.

According to this embodiment, a drawing region in which a mark such as an alignment mark is drawn can be determined (changed) in accordance with pattern elements (for example, a critical pattern) which form a circuit pattern to be drawn on the substrate ST. Therefore, degradation in alignment accuracy due to a shift in drawing timing can be suppressed (prevented) by matching the drawing timing of a critical pattern with that of a mark such as an alignment mark.

Fourth Embodiment

Figure 6:
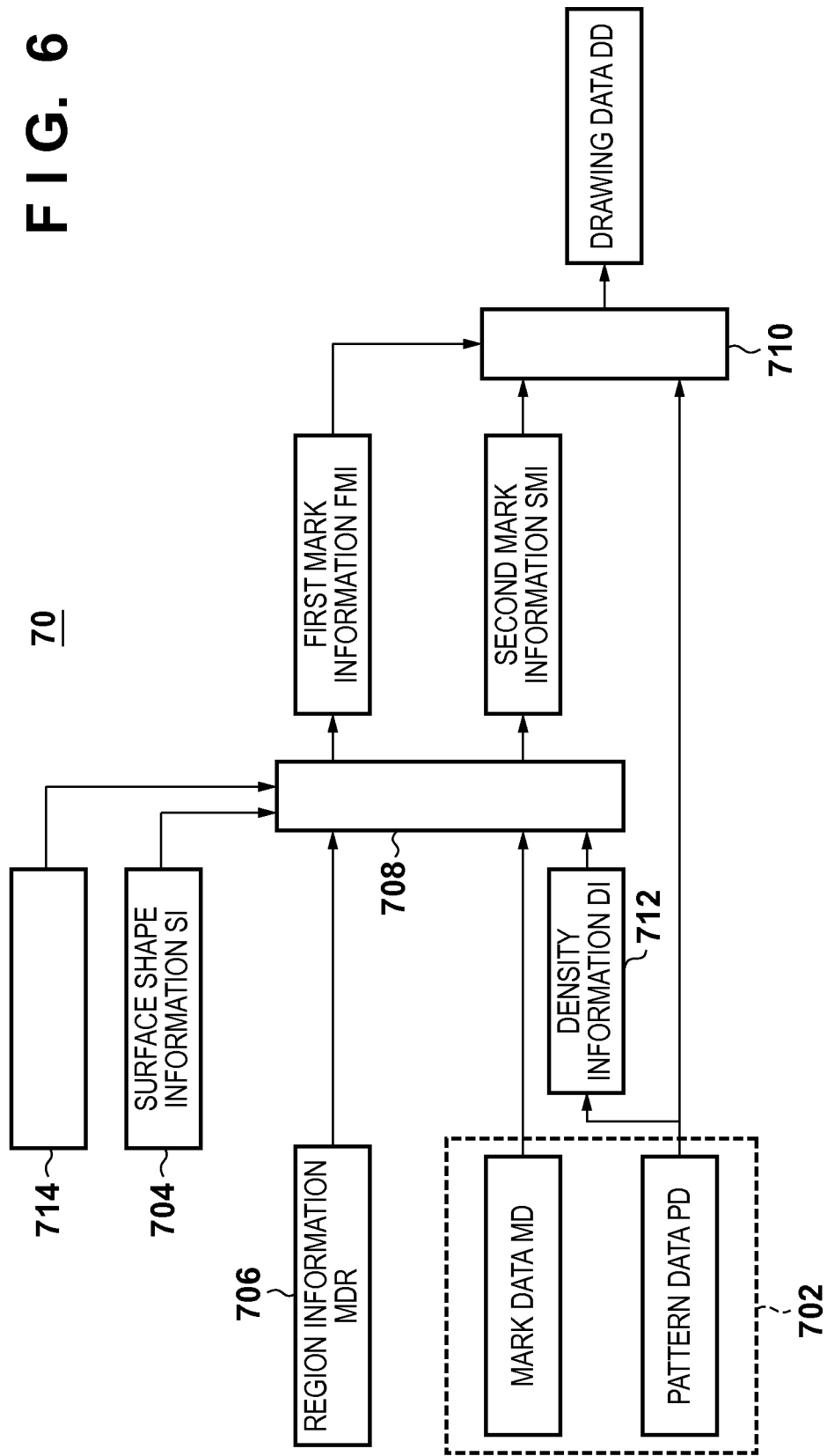
FIG. 6 is a block diagram showing the configuration of a drawing data generation unit in the fourth embodiment.

FIG. 6 is a block diagram showing the configuration of a drawing data generation unit 70 in the fourth embodiment. In the third embodiment, the determination unit 708 automatically specifies a critical pattern based on the density information DI calculated by the calculation unit 712. In the fourth embodiment, the user can arbitrarily designate pattern elements of interest (for example, a critical pattern) among pattern elements which form the circuit pattern.

Hence, in this embodiment, the drawing data generation unit 70 includes a selection unit 714 which selects pattern elements which form the circuit pattern from pattern data PD stored in a storage unit 702. The selection unit 714 selects pattern elements of interest from pattern elements which form the circuit pattern, in accordance with user designation. A determination unit 708 then determines the mark drawing region from a region, indicated by region information MDR held in a holding unit 706, so as to draw a mark in parallel with drawing of the pattern elements selected by the selection unit 714. Note that if the drawing data generation unit 70 includes a calculation unit 712, it is also possible to provide density information DI calculated by the calculation unit 712 to the user to allow him or her to designate pattern elements of interest while looking up the density information DI.

In this manner, in this embodiment, the mark drawing region (drawing timing) is determined in accordance with the drawing timing of the pattern elements selected by the selection unit 714. However, when identical circuit patterns are drawn in all of a plurality of chip regions (shot regions) on a substrate ST, there is no need to draw marks in all chip regions. Alternatively, the mark drawing region (drawing timing) may be changed for each chip region on the substrate ST.

In the case of a multibeam drawing apparatus, it is possible to simultaneously draw a circuit pattern and a mark because the field of drawing in parallel is large, as described above. Therefore, the mark drawing region (drawing timing) can be determined so as to draw a mark in parallel with drawing of the pattern elements selected by the selection unit 714. More specifically, the mark drawing region is determined from a region, in which a mark can be drawn, so as to draw a mark at the timing at which the pattern elements selected by the selection unit 714 are drawn, or at a timing as close to it as possible.

On the other hand, in the case of a single-beam drawing apparatus, it is impossible to simultaneously draw a circuit pattern and a mark. Therefore, the mark drawing region can be determined from a region, in which a mark can be drawn, so as to draw a mark at a timing as close to that at which the pattern elements selected by the selection unit 714 are drawn as possible. However, in a single-beam drawing apparatus, a substrate stage 60 must be moved in drawing a mark, so the mark drawing accuracy may become lower than in a multibeam drawing apparatus.

If an obtaining unit 704 obtains surface shape information SI, a region in which the flatness falls outside a tolerance may be excluded from the region indicated by the region information MDR held in the holding unit 706, based on the surface shape information SI, before the mark drawing region is determined. In this manner, by updating the region information MDR held in the holding unit 706, the mark drawing region can be efficiently determined based on the drawing timing of the pattern elements selected by the selection unit 714.

As in the first embodiment, if the region indicated by the region information MDR held in the holding unit 706 includes no sufficient region which satisfies a required flatness, the determination unit 708 can change the mark shape and dimension.

If the region indicated by the region information MDR includes no region which satisfies a required flatness, the determination unit 708 displays an error (or warning) message for notifying to that effect on a display unit (not shown) of the drawing apparatus 1, or records an error log in, for example, a memory of a control unit 80. However, if the region indicated by the region information MDR includes no region which satisfies a required flatness, the determination unit 708 may determine, as a mark drawing region, the drawing region designated by default setting, independently of the drawing timing of the pattern elements selected by the selection unit 714.

According to this embodiment, a drawing region in which a mark such as an alignment mark is drawn can be determined (changed) in accordance with pattern elements (for example, a critical pattern) which form a circuit pattern to be drawn on the substrate ST. Therefore, degradation in alignment accuracy due to a shift in drawing timing can be suppressed (prevented) by matching the drawing timing of the selected pattern elements with that of a mark such as an alignment mark.

Fifth Embodiment

Figure 7:
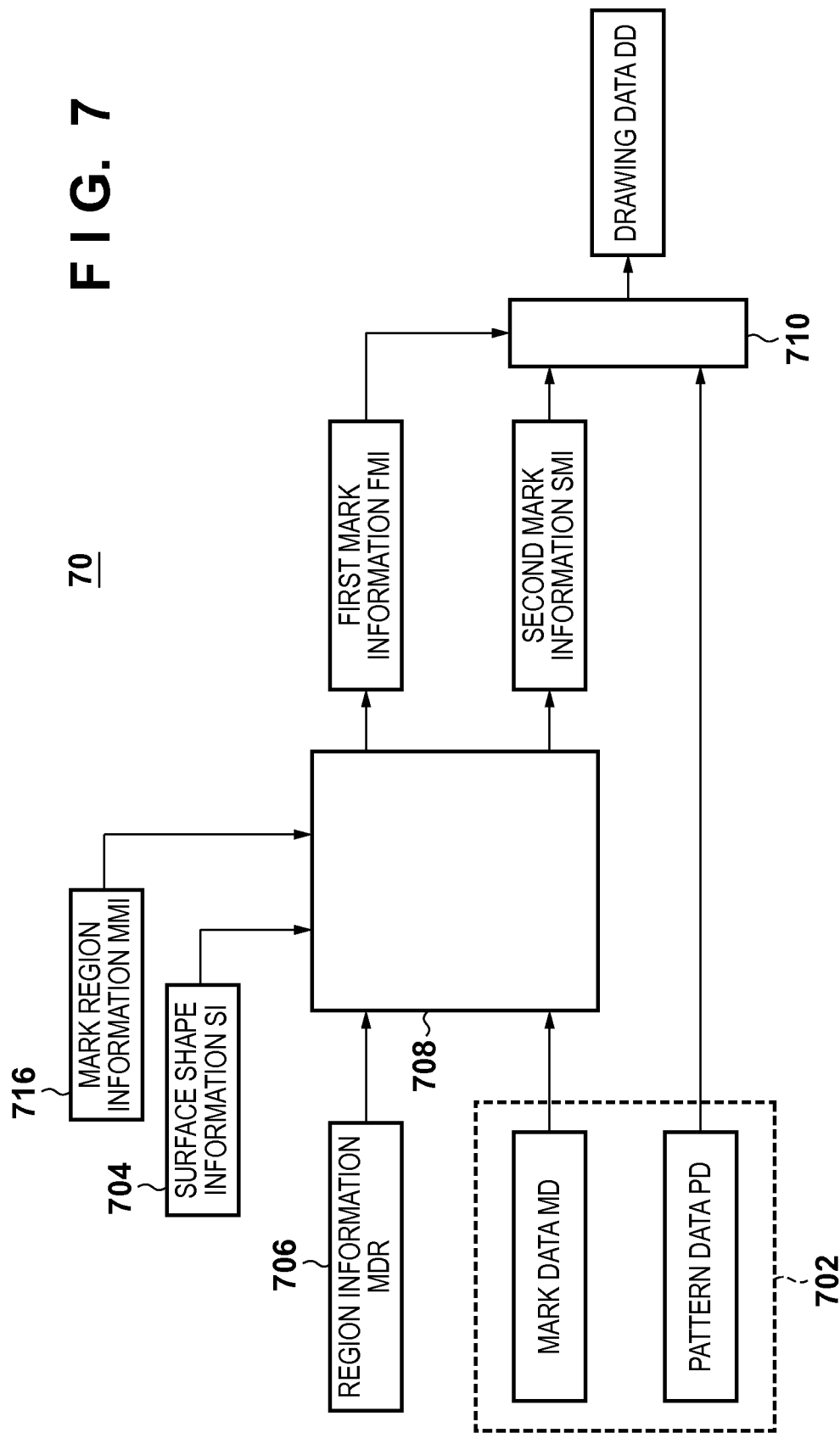
FIG. 7 is a block diagram showing the configuration of a drawing data generation unit in the fifth embodiment.

FIG. 7 is a block diagram showing the configuration of a drawing data generation unit 70 in the fifth embodiment. In this embodiment, the drawing region of a mark in a target layer to be formed on each layer formed on a substrate ST is determined based not only on surface shape information SI, environment information EI, and time information TI, but also on mark region information MMI indicating the drawing region of a mark drawn in each layer formed on the substrate ST.

Hence, in this embodiment, the drawing data generation unit 70 includes a management unit 716 which manages the mark region information MMI indicating the mark drawing region for each layer formed on the substrate ST. A determination unit 708 then determines, as a mark drawing region, a region which does not overlap marks drawn in layers below a target layer from a region indicated by region information MDR, based on the mark region information MMI managed by the management unit 716 for the target layer. With this operation, the mark drawn in the target layer can be prevented from overlapping the marks drawn in the layers below the target layer. Also, every time a mark is drawn in a layer formed on the substrate ST, the management unit 716 reflects on the mark region information MMI a region in which the mark is drawn. Note that the management unit 716 manages, as the mark region information MMI, not only the drawing region of a mark drawn in a layer formed on the substrate ST, but also the drawing region of a mark drawn in a layer to be formed on the substrate ST.

Figure 8:
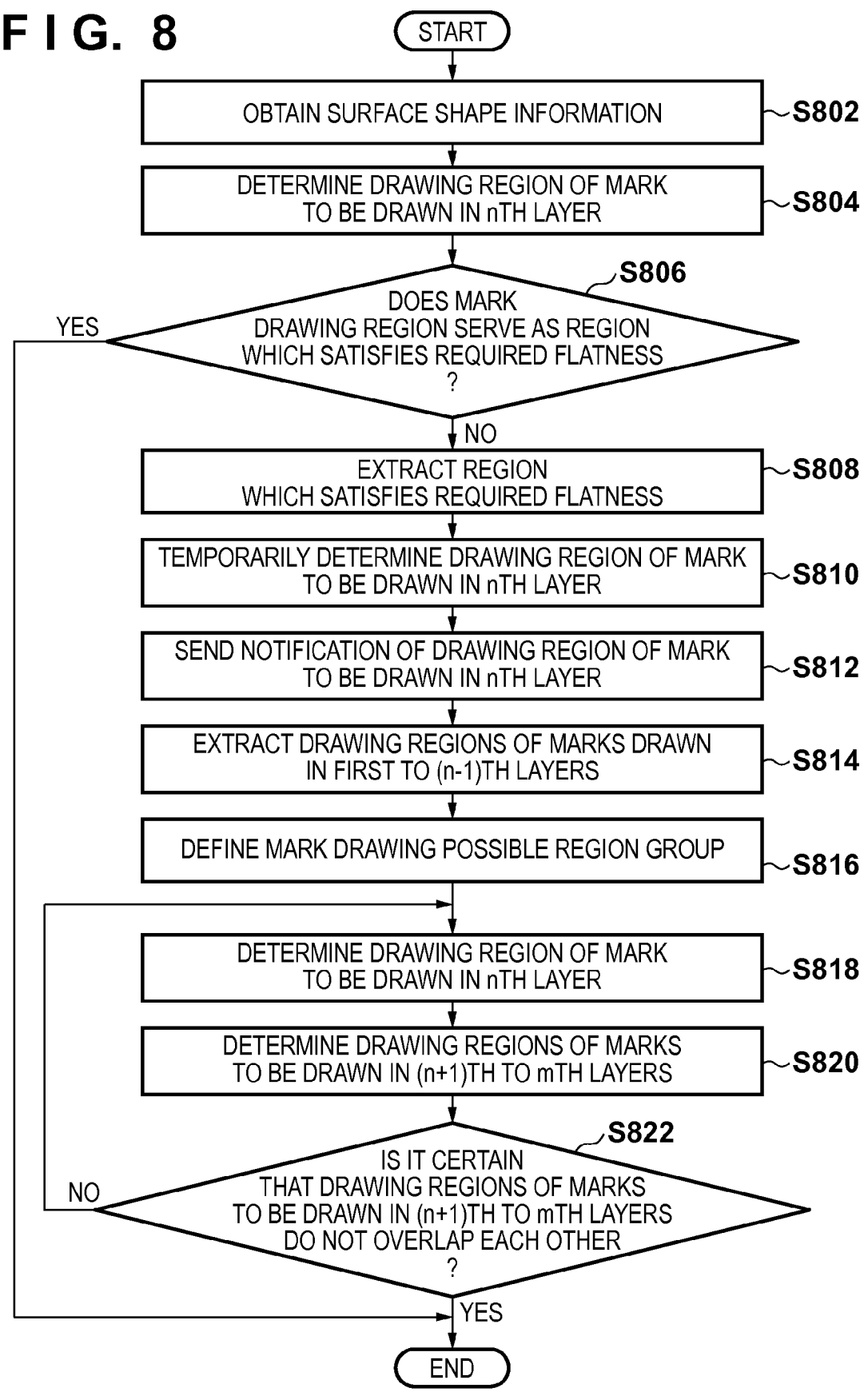
FIG. 8 is a flowchart for explaining a process by a determination unit in updating mark region information.

The mark region information MMI managed by the management unit 716 is updated (changed) using, for example, the measurement result of the flatness of the substrate ST (surface shape information SI) as a trigger. A process by the determination unit 708 in updating the mark region information MMI managed by the management unit 716 will be described with reference to FIG. 8. The case wherein the mark region information MMI is updated using the surface shape information SI as a trigger will be taken as an example in FIG. 8. However, the mark region information MMI may be updated using, as a trigger, the occurrence of a change in environment (for example, temperature) of a drawing apparatus 1, or a shift of charged particle beams by calibration.

In step S802, an obtaining unit 704 obtains the surface shape information SI indicating the flatness of the substrate ST at each position. In step S804, the determination unit 708 looks up the mark region information MMI managed by the management unit 716 to specify the drawing region of a mark to be drawn in the nth layer serving as a target layer.

In step S806, the determination unit 708 determines whether the mark drawing region specified in step S804 is a region which satisfies a required flatness, based on the surface shape information SI (step S802) obtained by the obtaining unit 704. If the mark drawing region specified in step S804 is a region which satisfies a required flatness, the process ends without updating the mark region information MMI managed by the management unit 716. On the other hand, if the mark drawing region specified in step S804 is not a region which satisfies a required flatness, the process advances to step S808.

In step S808, the determination unit 708 extracts the region which satisfies the required flatness from a region indicated by region information MDR held in a holding unit 706, based on the surface shape information SI (step S802) obtained by the obtaining unit 704. In step S810, the determination unit 708 temporarily determines, as the drawing region of a mark to be drawn in the nth layer, the region extracted in step S808. In step S812, the determination unit 708 notifies the management unit 716 of the mark drawing region temporarily determined in step S810, that is, the region temporarily determined as the drawing region of a mark to be drawn in the nth layer in step S810.

In step S814, the determination unit 708 looks up the mark region information MMI managed by the management unit 716 to extract the drawing regions of marks drawn in layers below the nth layer, that is, the first to (n−1)th layers. In step S816, the determination unit 708 excludes, from the mark drawing region temporarily determined in step S810, the mark drawing regions extracted in step S814, and defines a plurality of regions (mark drawing possible region group) in which a mark can be drawn in the nth layer. In step S818, the determination unit 708 selects one region (arbitrary region) from the mark drawing possible region group defined in step S816, and determines it as the drawing region of a mark drawn in the nth layer. In step S820, as in step S818, the determination unit 708 determines the drawing regions of marks to be drawn in the (n+1)th to mth layers to be formed on the nth layer. Also, the determination unit 708 notifies the management unit 716 of the region determined as the drawing region of a mark to be drawn in the nth layer in step S818, and the region determined as the drawing region of a mark drawn in each of the (n+1)th to mth layers in step S820. The management unit 716 then updates the mark region information MMI so as to reflect the notification from the determination unit 708 on it.

In step S822, the determination unit 708 looks up the mark region information MMI managed by the management unit 716 to determine whether the drawing regions of marks to be drawn in the (n+1)th to mth layers do not overlap each other. If it is determined in step S822 that the drawing regions of marks to be drawn in the (n+1)th to mth layers do not overlap each other, the process ends. On the other hand, if it is determined in step S822 that the drawing regions of marks to be drawn in the (n+1)th to mth layers do not overlap each other, the process advances to step S818, in which a new region is selected from the mark drawing possible region group, and determined as the drawing region of a mark to be drawn in the nth layer.

Note that even when steps S818 and S820 are repeated, it may still be the case that the drawing regions of marks to be drawn in the nth to mth layers cannot be determined, or some layer on the substrate ST includes no region which satisfies a required flatness. In such a case, an error (or warning) message for notifying to that effect is displayed on a display unit (not shown) of the drawing apparatus 1, or an error log is recorded in, for example, a memory of a control unit 80. Also, in such a case, the drawing region designated by default setting is determined as a mark drawing region.

Also, although the mark drawing region is determined in the order of lower layers (substrate-side layers) on the substrate ST to upper layers on the substrate ST, the order of layers in which the mark drawing region is to be determined is not limited to this. For example, a layer in which the mark drawing region is to be determined with high priority may be present, so the order of priority in which the mark drawing region is determined may be set for each layer to determine the mark drawing region in accordance with the set order of priority.

Figure 9:
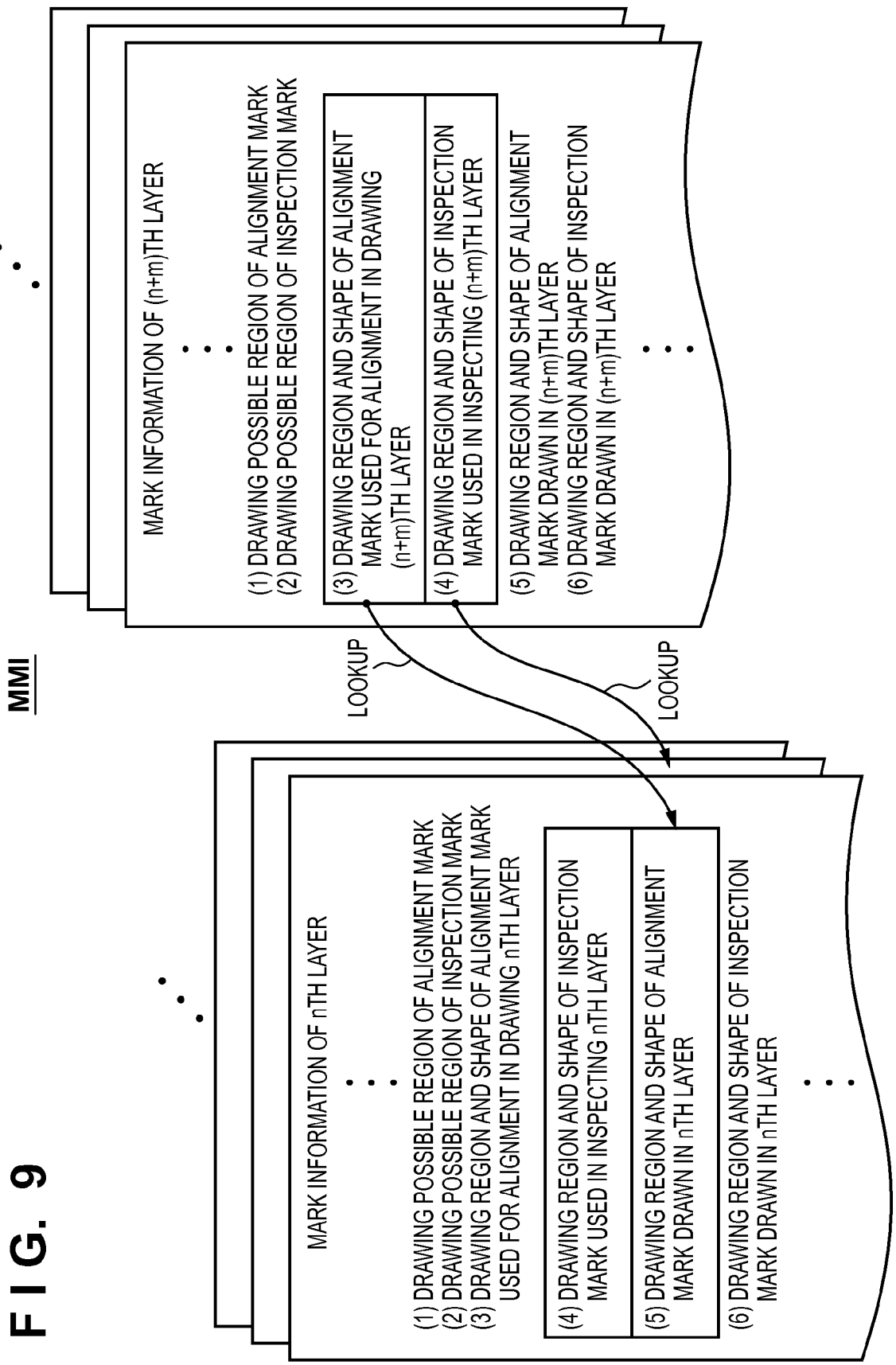
FIG. 9 is a view illustrating an example of mark region information managed by a management unit.

FIG. 9 is a view illustrating an example of the mark region information MMI managed by the management unit 716. The mark region information MMI includes pieces of mark information of respective layers on the substrate ST, which are associated with each other. Therefore, even when, for example, the drawing region of a mark to be drawn in each layer, or the shape of this mark is changed, a post-process (for example, an alignment process or an inspection process) can be performed without any problem by looking up the mark region information MMI. Note that FIG. 9 shows mark information of the nth layer, and mark information of the (n+m)th layer.

Referring to FIG. 9, the mark information of the nth layer includes the drawing possible region of an alignment mark, the drawing possible region of an inspection mark, and the drawing region and shape of an alignment mark used for alignment in drawing the nth layer. The mark information of the nth layer also includes the drawing region and shape of an inspection mark used in inspecting the nth layer, the drawing region and shape of an alignment mark drawn in the nth layer, and the drawing region and shape of an inspection mark drawn in the nth layer.

The drawing region of an alignment mark is selected from a region included in the drawing possible region of the alignment mark, and the drawing region of an inspection mark is selected from a region included in the drawing possible region of the inspection mark. Also, when an alignment mark drawn in the nth layer is used in aligning the (n+m)th layer, the drawing region and shape of an alignment mark drawn in the nth layer, which are included in the mark information of the nth layer, are looked up. Similarly, when an inspection mark drawn in the nth layer in inspecting the (n+m)th layer is used in inspecting the (n+m)th layer, the drawing region and shape of an inspection mark drawn in the nth layer, which are included in the mark information of the nth layer, are looked up.

According to this embodiment, a drawing region in which a new mark is drawn can be determined (changed) so marks such as an alignment mark and inspection mark drawn in each layer on the substrate ST do not overlap each other (that is, the drawing regions of already formed marks do not overlap each other).

As described in each embodiment, the drawing apparatus 1 can suppress (prevent) degradation in alignment accuracy and inspection accuracy, and can therefore align the charged particle beams and the substrate ST with high accuracy. Hence, the drawing apparatus 1 can provide articles (for example, a microdevice such as a semiconductor device or an element having a microstructure) with a high throughput and good economic efficiency. A method of manufacturing an article according to this embodiment includes a step of forming a latent image pattern on a photosensitive agent, applied on a substrate, using the drawing apparatus 1 (a step of performing drawing on a substrate), and a step of developing the substrate having the latent image pattern formed on it in the forming step. This method can also include subsequent known steps (for example, oxidation, film formation, vapor deposition, doping, planarization, etching, resist removal, dicing, bonding, and packaging). The method of manufacturing an article according to this embodiment is more advantageous in terms of at least one of the performance, quality, productivity, and manufacturing cost of an article than the conventional methods.

Note that the above-mentioned drawing apparatus is implemented by a drawing apparatus main body, and a computer system connected to the drawing apparatus main body via a network. Therefore, when feedback of information from the drawing apparatus main body is unnecessary, the computer system may perform a process of combining pattern data and mark data to generate drawing data.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-286620 filed on Dec. 27, 2011, which is hereby incorporated by reference herein in its entirety.

What is claimed is:

1. A drawing apparatus which draws a circuit pattern and a mark on a substrate with a charged particle beam based on drawing data, the apparatus comprising:
   a storage unit configured to store pattern data representing the circuit pattern and mark data representing the mark, respectively;
   an obtaining unit configured to obtain information associated with a positioning accuracy of the charged particle beam relative to the substrate;
   a determination unit configured to determine a drawing region for the mark relative to the circuit pattern based on the obtained information; and
   a generation unit configured to generate combined data by combining the pattern data and the mark data respectively stored in the storage unit such that the mark is drawn in the drawing region determined by the determination unit and convert the combined data into bitmap data, thereby generating the drawing data.

2. The apparatus according to claim 1, further comprising:
   a holding unit configured to store region information indicating a region, in which the mark can be drawn, on the substrate,
   wherein the determination unit is configured to determine the drawing region for the mark from the region indicated by the stored region information.

3. The apparatus according to claim 1, wherein the obtaining unit is configured to obtain flatness information indicating a flatness of the substrate as the information associated with the positioning accuracy, and
   the determination unit is configured to determine the drawing region for the mark from a region in which the flatness falls within a tolerance based on the obtained flatness information.

4. The apparatus according to claim 3, wherein the determination unit is configured to determine a shape and a dimension of the mark such that the mark is drawn in the region in which the flatness falls within the tolerance.

5. The apparatus according to claim 1, wherein
   the obtaining unit is configured to obtain time information indicating an execution time of calibration of the drawing apparatus as the information associated with the positioning accuracy, and
   the determination unit is configured to determine the drawing region for the mark based on the obtained time information such that the mark is drawn within a predetermined period after the execution time of the calibration.

6. The apparatus according to claim 1, wherein
   the obtaining unit is configured to obtain environment information indicating an environment of the drawing apparatus as the information associated with the positioning accuracy, and
   the determination unit is configured to determine the drawing region for the mark based on the obtained environment information such that the mark is drawn at a time at which the environment falls within a tolerance.

7. The apparatus according to claim 1, wherein
   the obtaining unit is configured to obtain density information indicating a density of a pattern element which constitutes the circuit pattern as the information associated with the positioning accuracy, and
   the determination unit is configured to determine the drawing region for the mark based on the obtained density information such that the mark is drawn in parallel with drawing of a pattern element group of which a density of a pattern element is not less than a predetermined value.

8. The apparatus according to claim 1, further comprising:
   a selection unit configured to select a pattern element which constitutes the circuit pattern from the pattern data,
   wherein the determination unit is configured to determine the drawing region for the mark such that the mark is drawn in parallel with drawing of the selected pattern element.

9. The apparatus according to claim 1, further comprising:
   a second storage unit configured to store mark region information indicating a mark drawing region with respect to each layer formed on the substrate
   wherein the determination unit is configured to determine the drawing region for the mark based on the stored mark region information such that the drawing region for the mark does not overlap a region of a mark already formed on the substrate.

10. The apparatus according to claim 1, wherein the mark includes an alignment mark used for an alignment and overlay between the circuit pattern and another circuit pattern different from the circuit pattern, or an inspection mark used in inspecting an overlay result between the circuit pattern and another circuit pattern different from the circuit pattern.

11. A method of manufacturing an article, the method comprising:
    performing drawing on a substrate using a drawing apparatus;
    developing the substrate on which the drawing has been performed; and
    processing the developed substrate to manufacture the article,
    wherein the drawing apparatus draws a circuit pattern and a mark on the substrate with a charged particle beam based on drawing data,
    the apparatus including
    a storage unit configured to store pattern data representing the circuit pattern and mark data representing the mark, respectively;
    an obtaining unit configured to obtain information associated with a positioning accuracy of the charged particle beam relative to the substrate;
    a determination unit configured to determine a drawing region for the mark relative to the circuit pattern based on the obtained information; and a generation unit configured to generate combined data by combining the pattern data and the mark data respectively stored in the storage unit such that the mark is drawn in the drawing region determined by the determination unit and convert the combined data into bitmap data, thereby generating the drawing data.

* * * * *